US010460862B2

(12) United States Patent
Doi et al.

(10) Patent No.: US 10,460,862 B2
(45) Date of Patent: Oct. 29, 2019

(54) MAGNESIUM DIBORIDE SUPERCONDUCTING THIN-FILM WIRE AND METHOD FOR PRODUCING SAME

(71) Applicant: HITACHI, LTD., Tokyo (JP)

(72) Inventors: Toshiya Doi, Kyoto (JP); Shigeru Horii, Kyoto (JP); Toshiaki Kusunoki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 15/512,014

(22) PCT Filed: Oct. 16, 2015

(86) PCT No.: PCT/JP2015/079249
§ 371 (c)(1),
(2) Date: Mar. 16, 2017

(87) PCT Pub. No.: WO2016/084513
PCT Pub. Date: Jun. 2, 2016

(65) Prior Publication Data
US 2017/0301444 A1    Oct. 19, 2017

(30) Foreign Application Priority Data

Nov. 28, 2014 (JP) ................................. 2014-241631

(51) Int. Cl.
*H01F 6/06* (2006.01)
*C01B 35/04* (2006.01)
(Continued)

(52) U.S. Cl.
CPC ............... *H01F 6/06* (2013.01); *C01B 35/04* (2013.01); *H01F 10/10* (2013.01); *H01F 41/14* (2013.01);
(Continued)

(58) Field of Classification Search
CPC . H01F 6/06; H01F 10/10; H01F 41/14; C01B 35/04
See application file for complete search history.

(56) References Cited

U.S. PATENT DOCUMENTS 5,238,913 A * 8/1993 Coppa ................. H01L 39/2464
204/192.34
2002/0173428 A1* 11/2002 Thieme ................. H01L 39/141
505/100

(Continued)

FOREIGN PATENT DOCUMENTS

JP     2004-307256 A    11/2004
JP     2007-314362 A    12/2007

OTHER PUBLICATIONS

Jung, S.G., Seong, W.K. and Kang, W.N., Effect of columnar grain boundaries on flux pinning in MgB2 films, J. Appl. Phys., Mar. 1, 2012, vol. 111, Issue 5, p. 053906-1,2,3,4,5.

(Continued)

*Primary Examiner* — Paul A Wartalowicz
(74) *Attorney, Agent, or Firm* — Volpe and Koenig, P.C.

(57) ABSTRACT

An object of the invention is to provide: an $MgB_2$ superconducting thin-film wire that exhibits excellent $J_c$ characteristics even under a 20 K magnetic field; and a method for producing thereof. The $MgB_2$ superconducting thin-film wire includes a long substrate and an $MgB_2$ thin film formed on the long substrate. The $MgB_2$ thin film has a microtexture such that $MgB_2$ columnar crystal grains stand densely together on the surface of the long substrate, and has $T_c$ of 30 K or higher. In grain boundary regions of the $MgB_2$ columnar crystal grains, a predetermined transition metal element is dispersed and segregated. The predetermined transition metal element is an element having a body-centered cubic lattice structure.

18 Claims, 13 Drawing Sheets

(51) Int. Cl.
*H01F 10/10* (2006.01)
*H01F 41/14* (2006.01)
*H01L 39/14* (2006.01)
*H01L 39/24* (2006.01)

(52) U.S. Cl.
CPC ........ *H01L 39/141* (2013.01); *H01L 39/2487* (2013.01); *C01P 2006/40* (2013.01)

(56) References Cited

U.S. PATENT DOCUMENTS

| | | | |
|---|---|---|---|
| 2005/0074220 A1* | 4/2005 | Rey | H01L 39/2487 385/141 |
| 2006/0093861 A1* | 5/2006 | Pogrebnyakov | C01B 35/04 428/704 |
| 2006/0258539 A1* | 11/2006 | Matsumoto | C23C 14/02 505/100 |
| 2008/0017279 A1* | 1/2008 | Venkataramani | B21C 37/047 148/400 |
| 2008/0064605 A1 | 3/2008 | Yamamoto et al. | |
| 2011/0082044 A1* | 4/2011 | Gilbert | H01L 39/12 505/237 |

OTHER PUBLICATIONS

International Search Report dated Nov. 24, 2015 in the International Application No. PCT/JP2015/079249.

* cited by examiner

MAGNESIUM DIBORIDE SUPERCONDUCTING THIN-FILM WIRE AND METHOD FOR PRODUCING SAME

TECHNICAL FIELD OF THE INVENTION

The present invention relates to magnesium diboride ($MgB_2$) superconducting wires, and particularly to an $MgB_2$ superconducting thin-film wire using an $MgB_2$ thin film as a superconductor and a method for producing the $MgB_2$ superconducting thin-film wire.

DESCRIPTION OF RELATED ART

An $MgB_2$ superconductor, which has a high critical temperature ($T_c$=39 K) as a metal superconductor, is expected to achieve a superconducting electromagnet that enables liquid helium free operation (e.g., at temperatures of 10 to 20 K). Also, by applying the $MgB_2$ superconductor to a superconducting electromagnet of a superconducting magnetic system, such as nuclear magnetic resonance (NMR) apparatuses, magnetic resonance imaging (MRI) apparatuses, magnetic suspension railways (Maglev Railways) operated at 4.2 K, it becomes possible to achieve a thermally-stable superconducting magnetic system since a temperature margin (difference between the critical temperature and the operating temperature) can become larger than before, thereby inhibiting quenching.

The superconducting wire for a superconducting electromagnet must be long (e.g., as long as 1 km or more) and maintain high current density even under a high magnetic field generated by the superconducting electromagnet itself. In this regard, since the $MgB_2$ superconductors are relatively new material and still under development, various research and development of $MgB_2$ superconducting wires are actively carried out from the aspects of both the methods for producing long wires and the improvement of superconducting properties.

Conventionally, research and development of $MgB_2$ superconducting wires have mainly focused on long superconducting wires fabricated by a powder-in-tube method. The powder-in-tube (PIT) method includes the steps of: filling a metal pipe with a raw powder (a mixed powder of an Mg (magnesium) powder and a B (boron) powder, or a synthesized $MgB_2$ powder, or a mixed powder additionally including a third element added to those powders); applying drawing to the metal pipe filled with the powder to form a wire; and applying thermal treatment (normally, 600° C. or higher) to synthesize and sinter a superconducting phase. The PIT method is advantageous to the production of long wires, however, $MgB_2$ superconducting wires made by this method have typical weak points in terms of superconducting properties.

On the other hand, there are methods for producing superconducting devices, including Josephson devices, using a vacuum process (thin film forming process). An $MgB_2$ superconducting thin film formed by the vacuum process is advantageous in that it exhibits critical current density higher than an $MgB_2$ superconducting wire made by the PIT method by one or more orders of magnitude under a 4.2 K magnetic field. Although it has been conventionally difficult to produce long wires by a vacuum process, recent progress of long wire production techniques that apply a vacuum process to oxide superconductors has raised expectations for achieving $MgB_2$ superconducting thin-film wires having high critical current density characteristics.

To improve superconducting properties (e.g., critical current density under a high magnetic field) of $MgB_2$ superconductors, it is effective to increase density of flux pinning centers by miniaturizing $MgB_2$ phase crystal grains (i.e., increasing crystal grain boundaries) or dispersing and segregating non-superconducting phase particulates. Various techniques regarding the improvement of superconducting properties have been reported.

Patent Literature 1 (JP 2007-314362 A) describes a method of growing columnar $MgB_2$ crystal grains tilted to the substrate normal by supplying magnesium (Mg) vapor and boron (B) vapor along a direction tilted to the substrate normal axis under a high vacuum. Also, disclosed is an $MgB_2$ superconducting thin film made up of plural layers containing $MgB_2$ columnar crystal grains wherein tilt angles of grain boundaries are different between adjacent layers. This can be achieved by controlling an angle of supplying magnesium (Mg) vapor and boron (B) vapor with regard to a substrate. According to Patent Literature 1, it seems to be possible to provide an $MgB_2$ superconducting thin film that exhibits high critical current density within a wide range of angle of the magnetic field applied.

Patent Literature 2 (JP 2004-307256 A) discloses an $MgB_2$-based superconductor fabricated by forming a powder mixture obtained by mixing an Mg powder, a B powder, and an element M (which is at least one of Ti, Zr and Hf) powder at an atomic ratio of Mg:B:M=1:2:x (wherein $0.001 \le x \le 0.1$) and sintering the mixture. The obtained $MgB_2$-based superconductor is characterized in that M is dispersed finely as a metal and/or a boride along the $MgB_2$ crystal grain boundaries and unavoidable impurities are also dispersed finely. According to Patent Literature 2, by adding a Ti, Zr and/or Hf element, it seems to be possible to provide an $MgB_2$-based superconductor having higher critical current density than that of conventional $MgB_2$-based superconductors as well as having a higher irreversibility magnetic field.

CITATION LIST

Patent Literature

Patent Literature 1: JP 2007-314362 A; and
Patent Literature 2: JP 2004-307256 A.

SUMMARY OF THE INVENTION

Problems to be Solved by the Invention

As described above, the $MgB_2$ superconducting thin film formed by a vacuum process exhibits higher critical current density ($J_c$) characteristics by one or more orders of magnitude, under a 4.2 K magnetic field, than those of the $MgB_2$ superconducting wire made by the PIT method. Therefore, it is expected that the $MgB_2$ superconducting thin film will exhibit excellent $J_c$ characteristics even under a 20 K magnetic field.

However, the inventors carried out examination and tests and found that the $MgB_2$ superconducting thin film formed by combining conventional techniques has significantly lower $J_c$ characteristics under the 20 K magnetic field than what is expected from the $J_c$ characteristics under the 4.2 K magnetic field (detail will be described later). This means that to apply the $MgB_2$ superconducting thin film to a superconducting wire used for a superconducting electromagnet, it is necessary to further improve superconducting properties (specifically, $J_c$ characteristics under the 20 K magnetic field) of the $MgB_2$ superconducting thin film.

In view of the foregoing, it is an objective of the present invention to provide an $MgB_2$ superconducting thin-film wire that exhibits excellent $J_c$ characteristics even under a 20 K magnetic field, and a method for producing the $MgB_2$ superconducting thin-film wire.

Solution to Problems (I) According to one aspect of the present invention, there is provided a magnesium diboride superconducting thin-film wire that includes a long substrate and a magnesium diboride thin film formed on the long substrate. The magnesium diboride thin film has a microtexture such that magnesium diboride columnar crystal grains stand densely together on the surface of the long substrate, and has critical temperature of 30 K or higher. In grain boundary regions of the magnesium diboride columnar crystal grains, a predetermined transition metal element is dispersed and segregated. The predetermined transition metal element is an element having a body-centered cubic lattice structure.

(II) According to another aspect of the present invention, there is provided a method for producing a magnesium diboride superconducting thin-film wire. The method includes the steps of: forming, on a long substrate, a magnesium diboride thin film having a microtexture such that magnesium diboride columnar crystal grains stand densely together on the surface of the long substrate, and having critical temperature of 30 K or higher; forming a layer of a predetermined transition metal element on the surface of the magnesium diboride thin film and/or between the long substrate and the magnesium diboride thin film; and diffusing the predetermined transition metal element preferentially into the grain boundary regions of the magnesium diboride columnar crystal grains by a heat treatment. The predetermined transition metal element is an element having a body-centered cubic lattice structure.

Advantages of the Invention

According to the present invention, there can be provided an $MgB_2$ superconducting thin-film wire that exhibits excellent $J_c$ characteristics even under a 20 K magnetic field, and a method for producing the $MgB_2$ superconducting thin-film wire.

DETAILED DESCRIPTION OF THE PREFERRED EMBODIMENTS

In the above magnesium diboride superconducting thin-film wire (I) of the invention, the following modifications and changes can be made.

(i) The predetermined transition metal element contains at least iron or manganese.

(ii) The magnesium diboride thin film has a laminate structure made up of a plurality of layers.

(iii) A layer of the transition metal element is formed on the surface of the magnesium diboride thin film.

(iv) A layer of the transition metal element is formed between the long substrate and the magnesium diboride thin film.

(v) A layer of the transition metal element is formed between the plurality of layers.

(vi) The long substrate contains iron as a main constituent.

In the above method for producing a magnesium diboride superconducting thin-film wire (II) of the invention, the following modifications and changes can be made.

(vii) The predetermined transition metal element contains at least iron or manganese.

(viii) The step of forming the magnesium diboride thin film includes a plurality of times of depositing magnesium diboride thin film layers to form a laminate structure made up of a plurality of layers.

(ix) The step of forming the magnesium diboride thin film further includes the step of depositing a transition metal element intermediate layer between depositing the magnesium diboride thin film layers.

(x) The magnesium diboride thin film is formed under a vacuum at temperatures from 250° C. to 300° C. in the step of forming the magnesium diboride thin film; and diffusion heat treatment for the transition metal element is performed under a vacuum at temperatures from 300° C. to below 600° C. in the step of diffusing the predetermined transition metal element.

(Problems with Conventional Techniques, Examination of Their Causes, and Basic Discussion)

First, the inventors, based on the knowledge of conventional techniques, prepared $MgB_2$ superconducting thin films and measured $J_c$ characteristics ($J_c$-B characteristics) under a magnetic field. The $MgB_2$ superconducting thin film was formed by a vacuum multi-source deposition technique using an Mg evaporation source and a B evaporation source (substrate temperature of 220° C.), and $J_c$-B was measured by a typical four-terminal electrical conduction method by vertically applying a magnetic field to the thin film surface.

Figure 1:
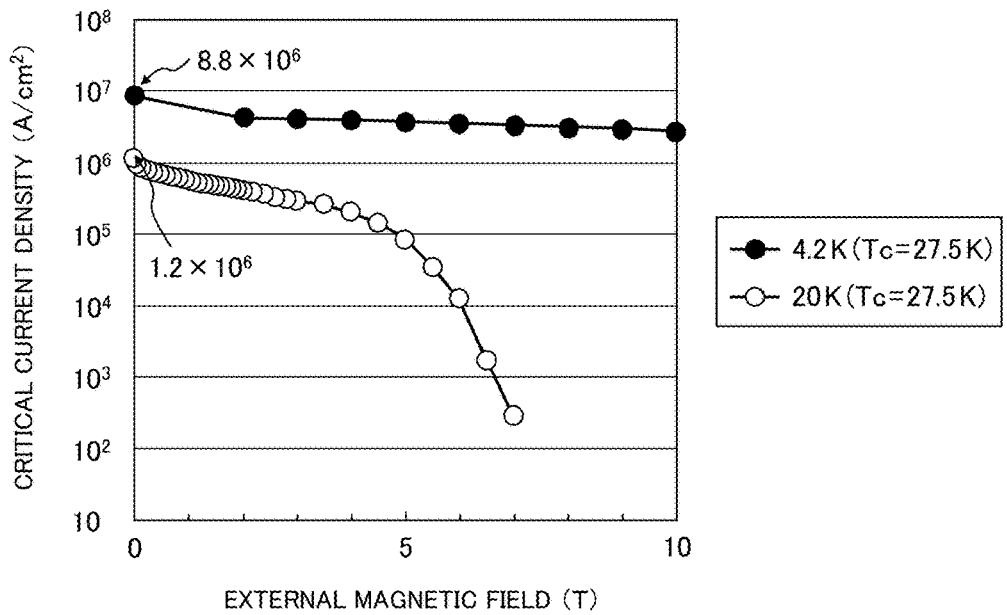
FIG. 1 is an exemplary graph showing a relationship between the critical current density ($J_c$) of the conventional $MgB_2$ superconducting thin film and the external magnetic field (B)

FIG. 1 is an exemplary graph showing a relationship between the critical current density ($J_c$) of the conventional $MgB_2$ superconducting thin film and the external magnetic field (B). As shown in FIG. 1, it is verified that there is almost no effect of the external magnetic field under a 4.2 K magnetic field, and high $J_c$ characteristics of $10^6$ A/cm$^2$ order are exhibited under the external magnetic field 0-10 T. By contrast, under a 20 K magnetic field, the $J_c$ decreases by almost one order of magnitude even under the external magnetic field 0 T (only self-magnetic field) and has significantly deteriorated with increasing the external magnetic field. As a result, the $J_c$ characteristics of the prepared $MgB_2$ superconducting thin film under the 20 K magnetic field were significantly low compared with what is expected from the $J_c$ characteristics under the 4.2 K magnetic field.

To examine the cause of this phenomenon, the inventors measured critical temperature ($T_c$) of the prepared $MgB_2$ superconducting thin film by a superconducting quantum interference device (SQUID). The result indicates that $T_c$ of the prepared $MgB_2$ superconducting thin film is 27.5 K which is significantly lower than the inherent $T_c$ of $MgB_2$ of 39 K. Because the $T_c$ of the prepared $MgB_2$ superconducting thin film became lower, a margin to the measured temperature became small, thereby it is considered that the $J_c$ characteristics at 20 K were deteriorated. Although an exact cause of the decrease of $T_c$ is not clarified, one of possible causes is incompleteness of the $MgB_2$ crystal structure resulting from low-temperature film deposition by during a vacuum process or from film deposition on a metal substrate.

Herein, brief discussion is given as to the fact that high $J_c$ characteristics were obtained under a 4.2 K magnetic field. The measured $MgB_2$ superconducting thin film still has a large margin between the critical temperature and the measured temperature of 4.2 K even if the $T_c$ thereof has decreased to 27.5 K. Accordingly, as for the measurement under a 4.2 K magnetic field, it is considered that the $MgB_2$ superconducting thin film is not substantially affected by the decrease of $T_c$. In addition, because the $MgB_2$ superconducting thin film is configured by minute crystal grains resulting from the low-temperature film deposition by a vacuum process, density of the crystal grain boundary becomes higher, and it seems to make a flux pinning force stronger.

To suppress decrease in $T_c$ of the $MgB_2$ superconducting thin film, the inventors examined and discussed a relationship between $T_c$ of the $MgB_2$ superconducting thin film and various film deposition conditions. And, it is found that it is possible to suppress decrease in $T_c$ by increasing temperature of the substrate during the film deposition step. Table 1 shows the result.

TABLE 1

Relationship between substrate temperature during $MgB_2$ thin film deposition and critical temperature.

| Substrate temperature during film deposition (° C.) | Critical temperature $T_c$ (K) |
| --- | --- |
| 200 | 18.8 |
| 220 | 27.5 |
| 250 | 30.4 |
| 280 | 33.5 |
| 300 | 33.9 |

Figure 2:
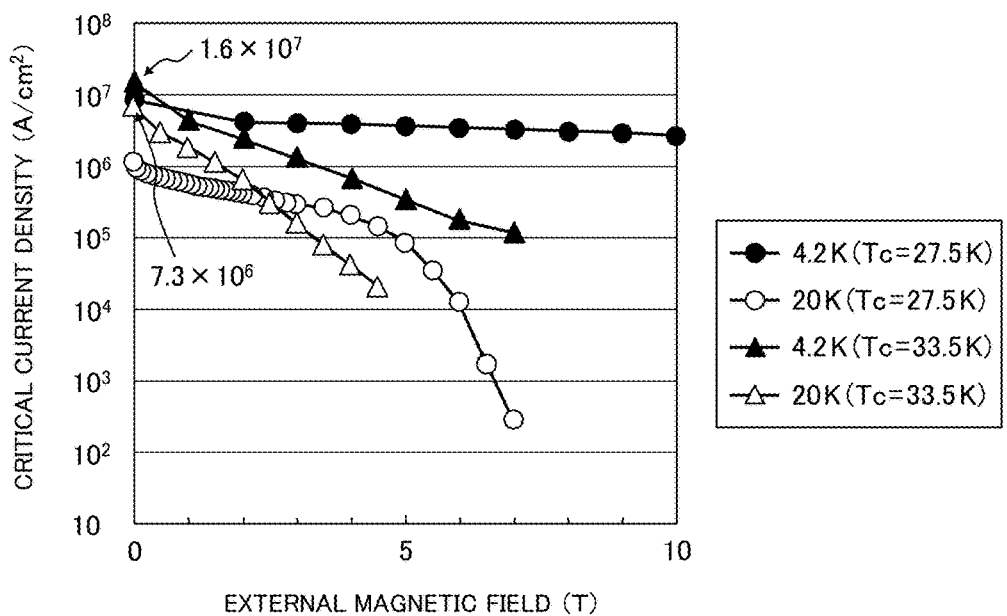
FIG. 2 is an exemplary graph showing a relationship between the critical current density ($J_c$) and the external magnetic field (B) of the $MgB_2$ superconducting thin film having a critical temperature of 33.5 K.

Then, $J_c$-B characteristics of the $MgB_2$ superconducting thin films having different $T_c$ were measured. FIG. 2 is an exemplary graph showing a relationship between the critical current density ($J_c$) and the external magnetic field (B) of the $MgB_2$ superconducting thin film having a critical temperature of 33.5 K. As a comparison, $J_c$-B characteristics of the $MgB_2$ superconducting thin film shown in FIG. 1 are also included in FIG. 2.

As shown in FIG. 2, the $MgB_2$ superconducting thin film having $T_c$ of 33.5 K exhibits higher $J_c$ characteristics than those of the $MgB_2$ superconducting thin film having $T_c$ of 27.5 K, at temperatures of both 4.2 K and 20 K under a relatively low external magnetic field. Specifically, the $J_c$ has been significantly improved at 20 K under an external magnetic field of 0 T, which verifies that impact of $T_c$ is great at 20 K. On the other hand, under a relatively high external magnetic field, at both temperatures, the $J_c$ of the $MgB_2$ superconducting thin film having $T_c$ of 33.5 K is lower than that of the $MgB_2$ superconducting thin film having $T_c$ of 27.5 K.

The results shown in FIG. 2 are discussed below. Decrease of $J_c$ under a high magnetic field means that the flux pinning force of the superconducting thin-film wire is insufficient. In the above-mentioned test, in order to suppress decrease of $T_c$, temperature of the substrate during the film deposition was increased, which might have caused crystal grains of the $MgB_2$ thin film to grow much larger. In other words, the crystal grain boundary density decreases due to the increase in size of the $MgB_2$ crystal grains, and therefore the flux pinning force would decrease. This indicates that more flux pinning centers need to be introduced into the $MgB_2$ superconducting thin film.

Based on these experimental results, in order to introduce the flux pinning centers, the inventors separately prepared $MgB_2$ superconducting thin films by adding, by means of a co-vapor-deposition technique, a third element (which seems to be effective for improving $J_c$ characteristics according to conventional techniques) other than the Mg and B, and measured $J_c$-B characteristics thereof. The results were that the obtained $MgB_2$ superconducting thin film specimens significantly varied and were not suitable for the measurement by a four-terminal electrical conduction method. This is considered because formation of the $MgB_2$ phase was inhibited (decrease in ratio of the $MgB_2$ phase formation) or the $T_c$ has significantly decreased. Because even such short specimens (approximately 30 mm) as are served for the $J_c$-B measurement the $J_c$ thereof significantly varies, it is considered difficult to produce a long thin-film wire by this technique.

The above-mentioned examination, tests, and discussion indicate that in order to obtain an $MgB_2$ superconducting thin-film wire that exhibits excellent $J_c$ characteristics even under a 20 K magnetic field, it is important to suppress the decrease of $T_c$ of the $MgB_2$ thin film as much as possible, and to increase the flux pinning center density without inhibiting the formation of the $MgB_2$ phase. Also, when introducing minute non-superconducting phase particles of a third element to make them serve as flux pinning centers, it is indicated that simple addition of a third element by the co-vapor-deposition technique is not preferable.

The inventors actively carried out discussions to achieve an $MgB_2$ superconducting thin-film wire having a microstructure suitable for the improvement of the superconducting properties. As a result, the inventors found a production method whereby a third element is preferentially diffused into the grain boundary regions of $MgB_2$ crystal grains after an $MgB_2$ thin film is formed. Thus, the present invention has been completed.

Hereinafter, with reference to the accompanying drawings, preferred embodiments of the present invention will be described by following the production procedures. However, the invention is not limited to specific embodiments described below, and various combinations and modifications are possible without departing from the technical concept of the invention. The same sign is provided for the same member and portion, and description of overlap will be omitted.

First Embodiment {Method for Producing $MgB_2$ Superconducting Thin-Film Wires}

(Production Apparatus)

Figure 3:
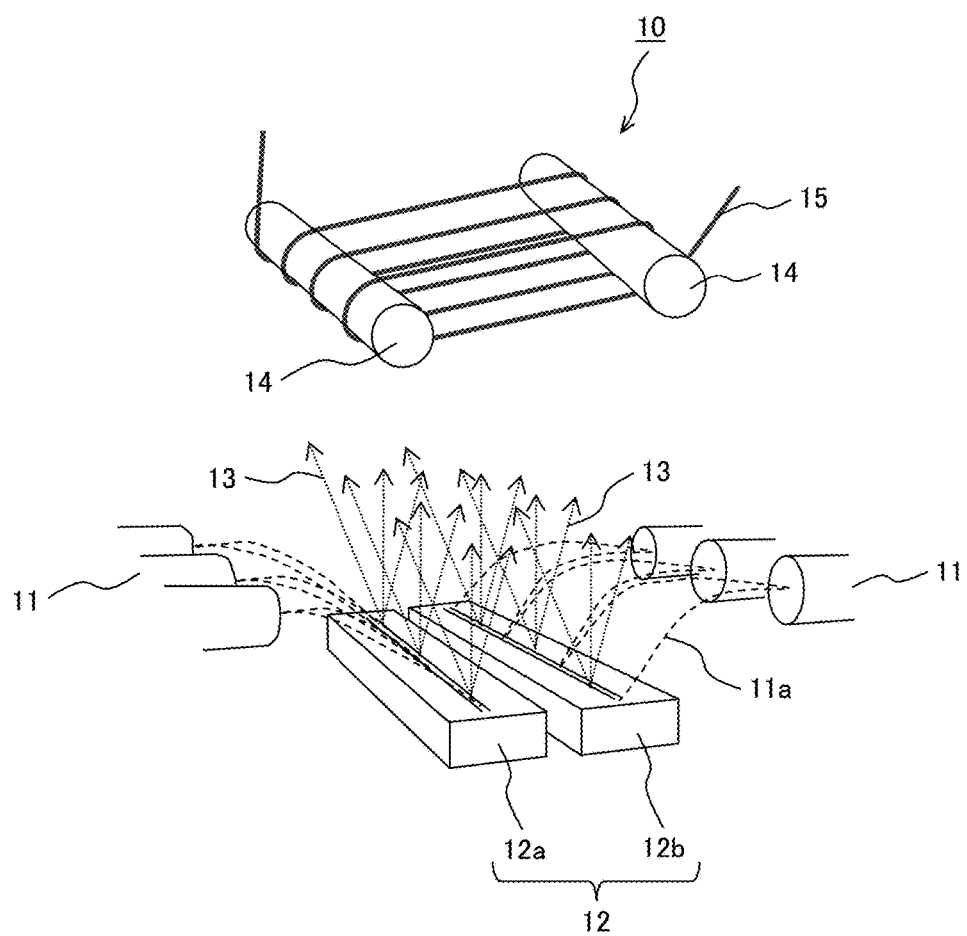
FIG. 3 is a schematic illustration showing a perspective view of an example of an $MgB_2$ thin film formation mechanism in the invented apparatus for producing $MgB_2$ superconducting thin-film wires.

FIG. 3 is a schematic illustration showing a perspective view of an example of an $MgB_2$ thin film formation mechanism in the invented apparatus for producing $MgB_2$ superconducting thin-film wires. In the example, an electron beam co-vapor-deposition technique is used. As illustrated in FIG. 3, the $MgB_2$ thin film formation mechanism 10 deflects and accelerates electron beams 11a emitted from an electron gun array 11, and irradiates the electron beams onto two linear-type raw material evaporation sources 12 (Mg evaporation source 12a, B evaporation source 12b). Then, raw material vapor 13 evaporated by heating is co-deposited on a tape-like long substrate 15 wound around a reel 14 more than once. The long substrate 15 is heated by a heater, not shown, (such as a heater built in the reel 14 or a heater heating the long substrate 15 from behind) to a predetermined temperature. Then, Mg atoms and B atoms that have reached the surface of the long substrate 15 chemically combine to form an $MgB_2$ thin film. The entire $MgB_2$ thin film formation mechanism 10 is encased in a vacuum chamber (not shown).

Furthermore, in addition to the above-mentioned $MgB_2$ thin film formation mechanism 10, the invented production apparatus of $MgB_2$ superconducting thin-film wires also has the following mechanisms: a transition metal element layer formation mechanism (not shown) for introducing a transition metal element, serving as a flux pinning center, into the $MgB_2$ thin film, and a superconducting stabilizing layer formation mechanism (not shown) for forming a superconducting stabilizing layer on the $MgB_2$ thin film. These two mechanisms are separately encased in different vacuum chambers and connected to the vacuum chamber of the $MgB_2$ thin film formation mechanism 10.

In the above example, an electron beam vapor-deposition technique is applied to form the $MgB_2$ thin film, the transition metal element layer, and the superconducting stabilizing layer. However, the invented production method is not limited to the technique, and as long as the desired $MgB_2$ thin film, transition metal element layer, and the superconducting stabilizing layer are obtained, other well-known film formation methods (e.g., vapor-deposition technique by heating by a heater, sputtering technique) can be used to form each layer.

(Long Substrate Preparation Step)

In this step, a long substrate 15 served as a base of the $MgB_2$ superconducting thin-film wire is prepared. Material of the long substrate 15 is not particularly limited as far as the long substrate 15 is long enough for the use as a superconducting wire and has mechanical characteristics (e.g., 0.2% proof strength) and heat resistance to withstand heat treatment applied during the superconducting wire production steps. For example, stainless steels, silicon steels, Ni (nickel)-based superalloys, Cu (copper) alloys, or the like can be preferably used. It is desirable that the surface of the substrate be cleaned before use to avoid inhibiting the thin film formation in the post process.

($MgB_2$ Thin Film Formation Step)

In this step, an $MgB_2$ thin film is formed on a long substrate 15 by a vacuum process. It is preferable that the $MgB_2$ thin film formation step be performed under the condition that the substrate temperature is from 250° C. to 300° C. under a vacuum, and more preferably from 280° C. to 300° C. When the temperature of the long substrate 15 is lower than 250° C., the $T_c$ of the $MgB_2$ thin film formed is prone to become lower than 30 K, which makes it impossible to obtain excellent $J_c$ characteristics under a 20 K magnetic field. By contrast, when the temperature of the long substrate 15 is over 300° C., Mg components having high vapor pressure are prone to scatter (re-evaporation), decreasing a formation ratio of the $MgB_2$ phase.

Meanwhile, in superconducting devices, having high $J_c$ characteristics is important. Because flowing current itself is very small in the superconducting devices, thickness of the superconducting thin film may be nanometers order (e.g., 10 to 500 nm). On the other hand, to apply superconducting wires to power-related devices (e.g., superconducting electromagnets, power cables), having high $J_c$ characteristics and high electrical conduction characteristics is important. Accordingly, it is necessary to make the cross-sectional area of the conductor large. To do so, thickness of the $MgB_2$ thin film to be applied to power-related devices is preferably micrometers order (e.g., 1 to 50 μm).

Figure 4A:
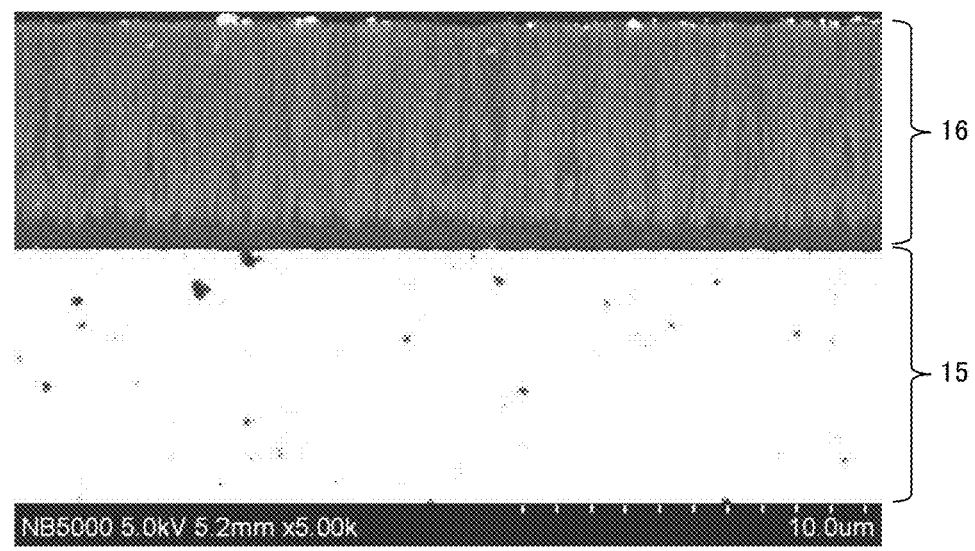
FIG. 4A is an image of a scanning electron microscopy (SEM) showing an example of a cross-sectional microtexture of the $MgB_2$ thin film after the film formation step.
Figure 4B:
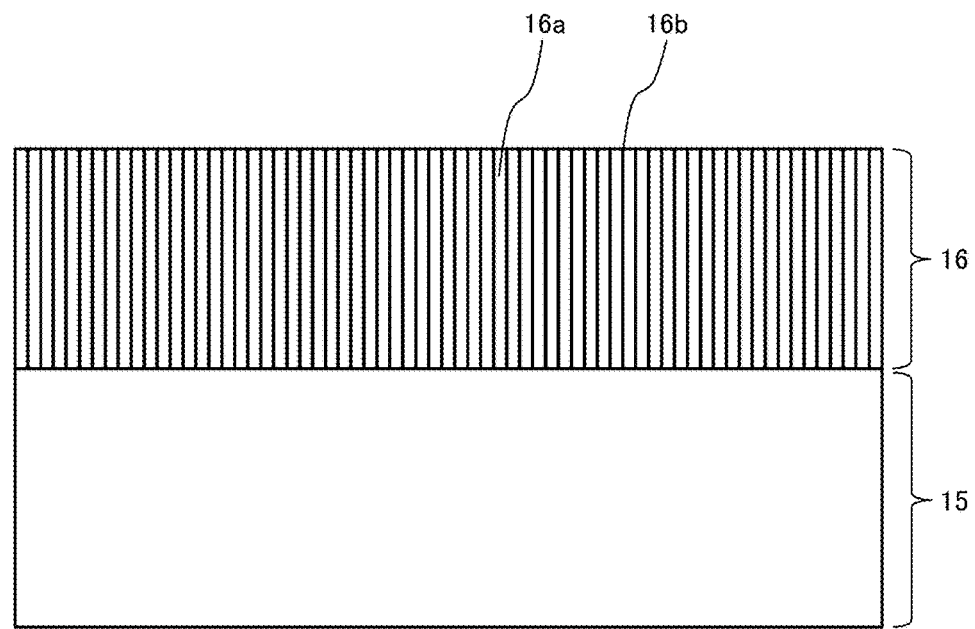
FIG. 4B is a schematic illustration of FIG. 4A.
Figure 5:
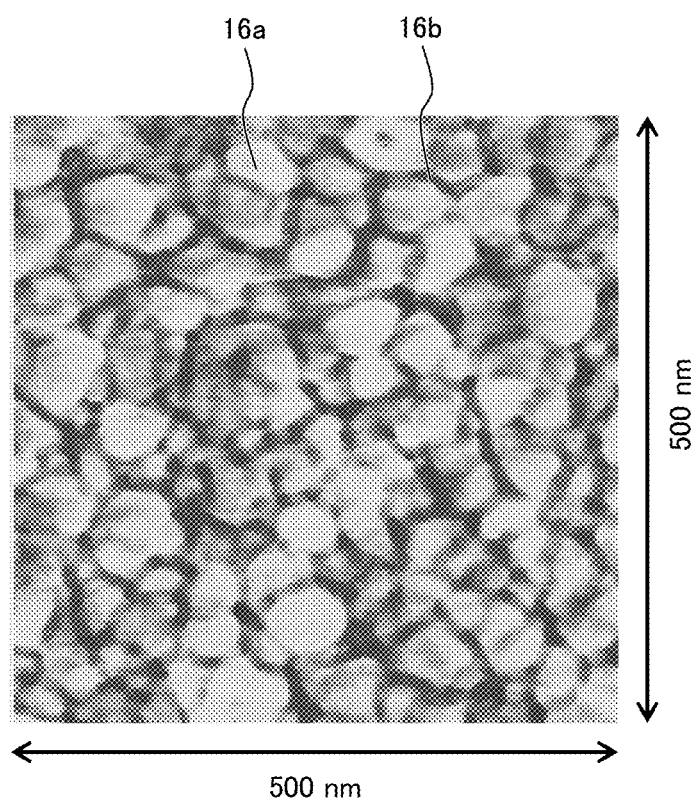
FIG. 5 is a phase image of an atomic force microscopy (AFM) showing an example of a surficial microtexture of the $MgB_2$ thin film.

FIG. 4A is an image of a scanning electron microscopy (SEM) showing an example of a cross-sectional microtexture of the $MgB_2$ thin film after the film formation step. FIG. 4B is a schematic illustration of FIG. 4A. FIG. 5 is a phase image of an atomic force microscopy (AFM) showing an example of a surficial microtexture of the $MgB_2$ thin film. As shown in those figures, the invented $MgB_2$ thin film 16 has a microtexture (microstructure) in which a large number of $MgB_2$ columnar crystal grains 16a stand densely together (like a dense forest) on the surface of the long substrate 15, and consequently, grain boundary regions 16b of the $MgB_2$ columnar crystal grains 16a have been densely formed.

(Transition Metal Element Layer Formation Step)

Figure 6:
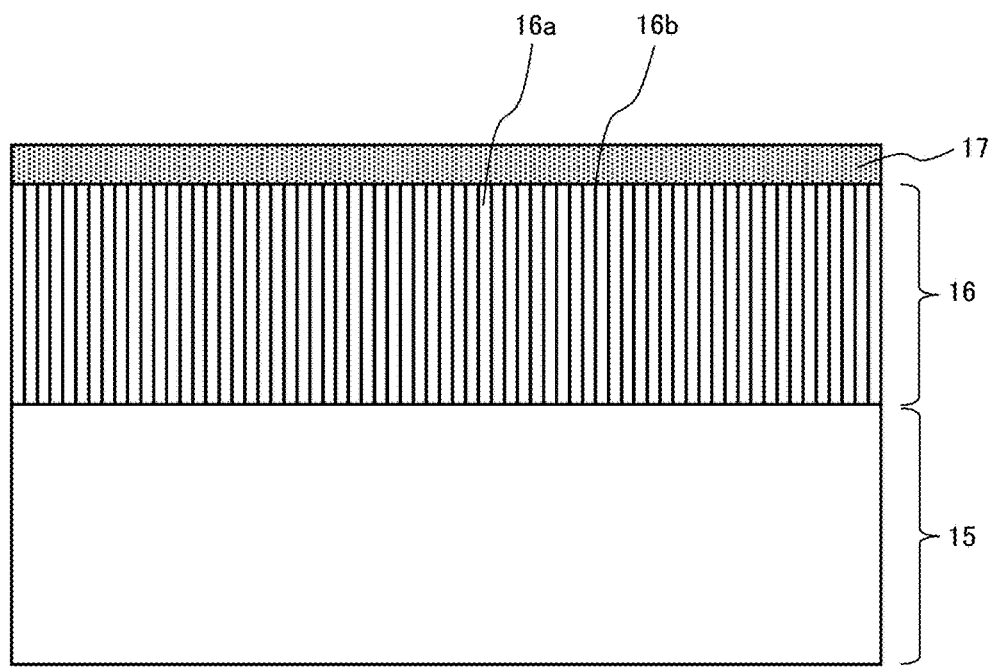
FIG. 6 is a schematic illustration showing an example of a cross-sectional microstructure of the $MgB_2$ thin film after the transition metal element layer formation step.

This is a pre-step for introducing a transition metal element serving as a flux pinning center into an $MgB_2$ thin film, in which a transition metal element layer is formed by a vacuum process so as to be in contact with the MgB$_2$ thin film 16. FIG. 6 is a schematic illustration showing an example of a cross-sectional microstructure of the MgB$_2$ thin film after the transition metal element layer formation step. As illustrated in FIG. 6, a transition metal element layer 17 is formed on the surface of the MgB$_2$ thin film 16.

In order to make the transition metal element favorably serve as a flux pinning center without adversely affecting the MgB$_2$ phase, it is preferable that transition metal elements constituting a transition metal element layer 17 be difficult to chemically combine with an MgB$_2$ phase and can easily attract the magnetic flux. Specifically, it is preferable that the transition metal element have a body-centered cubic lattice structure (bcc structure) to avoid chemical combination with hexagonal system MgB$_2$ crystals, and more preferably, the element also has magnetic properties to easily attract the magnetic flux.

More specifically, V (vanadium, melting point of 1910° C.), Mn (manganese, melting point of 1246° C.), Fe (iron, melting point of 1538° C.), Nb (niobium, melting point of 2477° C.), Mo (molybdenum, melting point of 2623° C.), Ta (tantalum, melting point of 3017° C.), and W (tungsten, melting point of 3422° C.) are applicable. Also, in order to properly disperse and segregate those metal elements in the grain boundary regions 16b of MgB$_2$ columnar crystal grains 16a by means of diffusion, metal elements having a relatively low melting point are preferable. From this aspect, the Mn and the Fe are more preferable, and including Fe is specifically more preferable since the Fe is a magnetic metal.

As far as the transition metal element layer 17 is thick enough to diffuse and supply flux pinning centers into the grain boundary regions 16b, a small thickness (e.g., 1 to 10 nm) is basically appropriate. Also, the transition metal element layer 17 can be used to simultaneously serve as a barrier layer to prevent chemical combination between the MgB$_2$ thin film 16 and a superconducting stabilizing layer, by taking advantage of the property that is difficult to chemically combine with an MgB$_2$ phase. In that case, the transition metal element layer 17 should be thicker (e.g. 100 nm) to allow the transition metal element layer 17 to remain after the diffusion thermal treatment in the post process. Thus, the thickness of the transition metal element layer 17 is preferably from 1 nm to 100 nm.

When the transition metal element layer 17 is used to simultaneously function as a barrier layer, a laminate structure may be applicable in which an Mn layer or a Fe layer mainly serving as a flux pinning center supply layer is laminated with an Nb layer, an Mo layer, or a Ta layer mainly serving as a barrier layer.

(Diffusion Heat Treatment Step)

Figure 7:
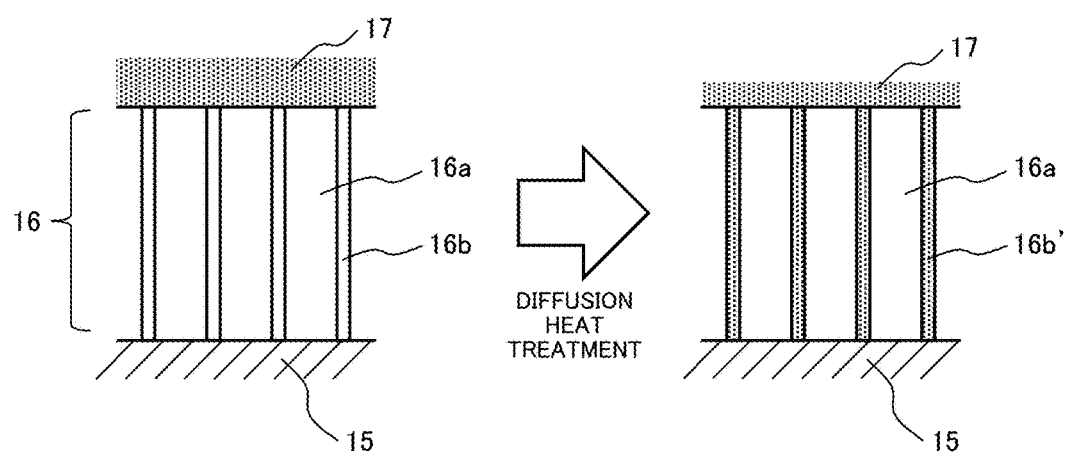
FIG. 7 is a schematic illustration showing an enlarged cross-sectional view of the $MgB_2$ thin film in the diffusion heat treatment step.

In this step, diffusion heat treatment is performed to introduce a transition metal element serving as a flux pinning center into the grain boundary regions 16b of the MgB$_2$ thin film 16. FIG. 7 is a schematic illustration showing an enlarged cross-sectional view of the MgB$_2$ thin film in the diffusion heat treatment step. As illustrated in FIG. 7, transition metal elements constituting the transition metal element layer 17 are preferentially diffused into the grain boundary regions 16b (grain boundary diffusion), thereby forming grain boundary regions 16b' in which transition metal elements are dispersed and segregated.

As for the conditions for diffusion heat treatment, a temperature from 300° C. to below 600° C. in a non-oxidizing atmosphere (substantially oxygen-free atmosphere, for example, under a vacuum or in high-purity argon) is preferable; a temperature from 330° C. to 580° C. is more preferable; and a temperature from 350° C. to 550° C. is particularly more preferable. If the heat treatment temperature is lower than 300° C., a diffusion phenomenon itself does not actually occur since the temperature is too low. By contrast, if the heat treatment temperature is 600° C. or higher, MgB$_2$ columnar crystal grains 16a start to sinter together increasing grain diameter (i.e., decrease of grain boundary density), and in addition, the formation ratio of the MgB$_2$ phase decreases due to bulk diffusion of the transition metal elements into the MgB$_2$ columnar crystal grains. In other words, by applying a heat treatment at temperatures from 300° C. to below 600° C., grain boundary diffusion occurs preferentially. Therefore, it is possible to form grain boundary regions 16b' in which the transition metal elements are dispersed and segregated along the crystal grain boundaries, without adversely affecting the MgB$_2$ phase.

(Superconducting Stabilizing Layer Formation Step)

Figure 8:
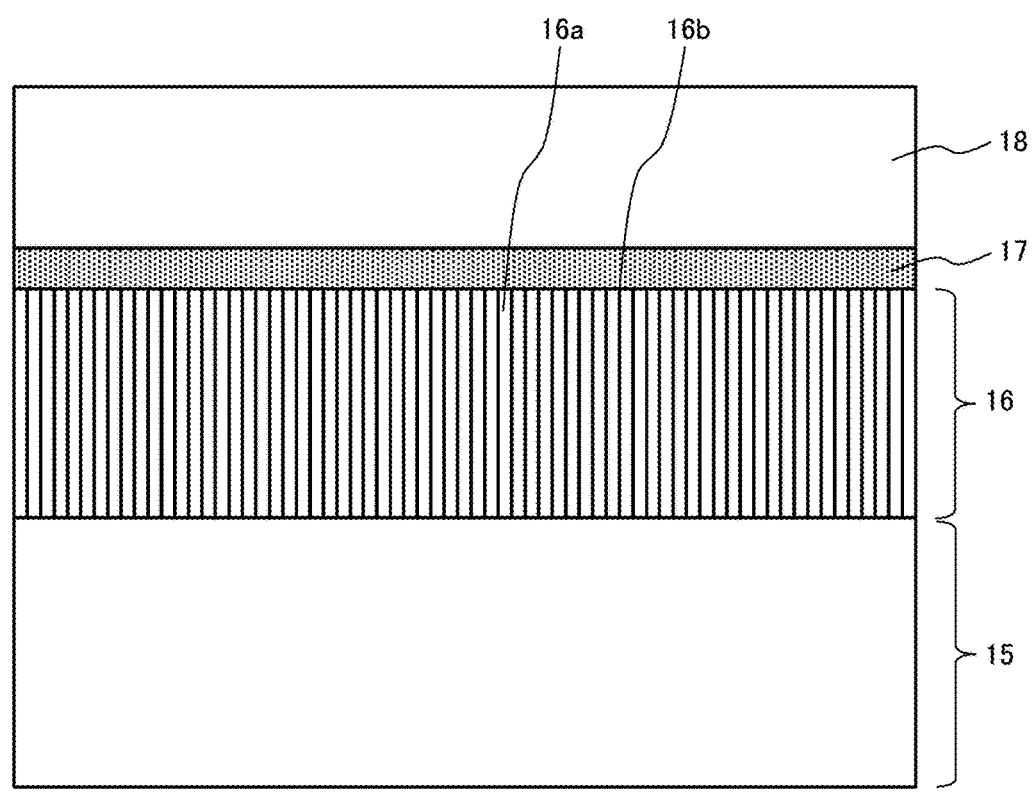
FIG. 8 is a schematic illustration showing an example of a cross-sectional microstructure of the $MgB_2$ superconducting thin-film wire after the superconducting stabilizing layer formation step.

In this step, a superconducting stabilizing layer is formed on the transition metal element layer 17 by a vacuum process. FIG. 8 is a schematic illustration showing an example of a cross-sectional microstructure of the MgB$_2$ superconducting thin-film wire after the superconducting stabilizing layer formation step. As illustrated in FIG. 8, a superconducting stabilizing layer 18 is formed on the surface of the transition metal element layer 17.

Low electrical resistance metal (e.g., oxygen-free copper or pure aluminum) is preferably used as a material of the superconducting stabilizing layer 18. Thickness of the superconducting stabilizing layer 18 is determined according to stabilization design of the superconducting wire, and for example, the thickness would be equivalent to or more than the thickness of the MgB$_2$ thin film 16.

Herein, description has been given indicating that the superconducting stabilizing layer formation step comes after the diffusion heat treatment step. However, the present invention is not limited to that order, and the superconducting stabilizing layer formation step may be performed between the transition metal element layer formation step and the diffusion heat treatment step.

By following the above-mentioned steps, the MgB$_2$ superconducting thin-film wire of the invention is completed.

Second Embodiment

{MgB$_2$ Superconducting Thin-Film Wire}

The inventors prepared the following MgB$_2$ superconducting thin-film wires according to the above-mentioned production method. First, an Ni-based superalloy tape was used as a long substrate 15, and an MgB$_2$ thin film 16 (thickness of 10 μm) was deposited on the long substrate 15 by the electron beam co-vapor-deposition technique (substrate temperature of 280° C.) as shown in FIG. 3. Next, an Fe layer (thickness of 100 nm) serving as a transition metal element layer 17 was formed on the MgB$_2$ thin film 16. Then, the diffusion heat treatment was applied in which the thin film was kept under a vacuum at 540° C. for one hour. Finally, a Cu layer (thickness of 10 μm) serving as a superconducting stabilizing layer 18 was formed on the MgB$_2$ thin film 16 (on the former transition metal element layer 17).

Figure 9:
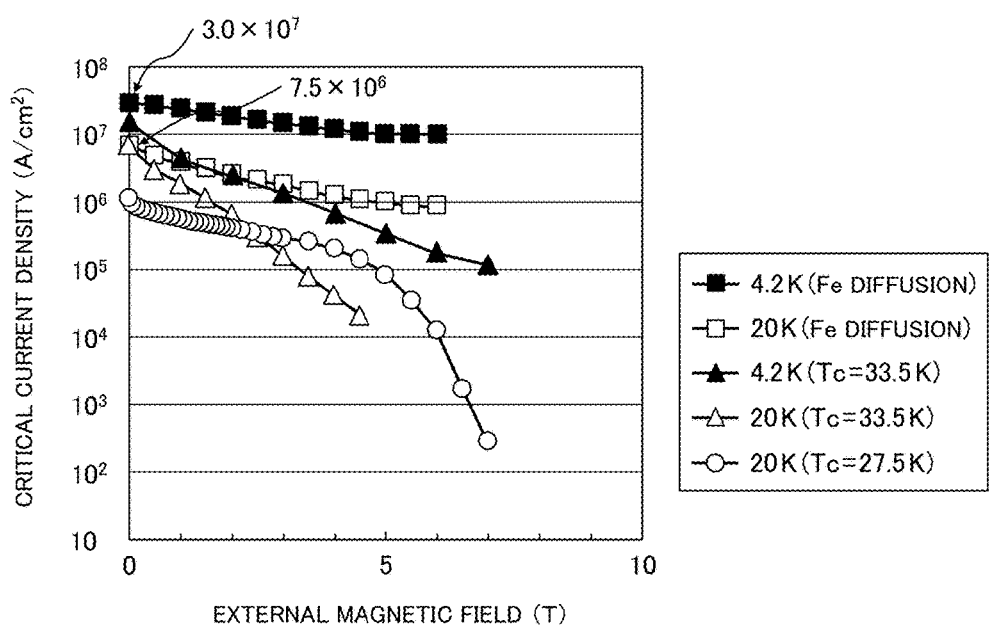
FIG. 9 is an exemplary graph showing a relationship between the critical current density ($J_c$) and the external magnetic field (B) in the invented $MgB_2$ superconducting thin-film wire.

The $J_c$-B characteristics of the prepared MgB$_2$ superconducting thin-film wire were measured. FIG. 9 is an exemplary graph showing a relationship between the critical current density ($J_c$) and the external magnetic field (B) in the invented MgB$_2$ superconducting thin-film wire. As a comparison, the $J_c$-B characteristics of the MgB$_2$ superconducting thin-film wires shown in FIGS. 1 and 2 are also included in FIG. 9.

As shown in FIG. 9, the invented $MgB_2$ superconducting thin-film wire exhibits higher $J_c$ characteristics than those of the $MgB_2$ superconducting thin-film wires shown in FIGS. 1 and 2, at temperatures of both 4.2 K and 20 K under the external magnetic field ranging from 0 to 6 T. Specifically, the $J_c$ is significantly improved under a high external magnetic field, which verifies that flux pinning centers other than crystal grain boundaries have been introduced.

Furthermore, the critical temperature of the $MgB_2$ superconducting thin-film wire is 34.7 K which has been further improved than that of the $MgB_2$ superconducting thin-film wire ($T_c$=33.5 K) shown in FIG. 2. This is probably because the diffusion heat treatment improves crystallinity of the $MgB_2$ columnar crystal grains 16a in addition to the inclusion of flux pinning centers in the $MgB_2$ thin film.

The above-mentioned result verifies that the invented $MgB_2$ superconducting thin-film wire is capable of suppressing the decrease of $T_c$ and simultaneously including the flux pinning centers other than the crystal grain boundaries and exhibits excellent $J_c$ characteristics even under a 20 K magnetic field.

Third Embodiment

{$MgB_2$ Superconducting Thin-Film Wire}

Figure 10:
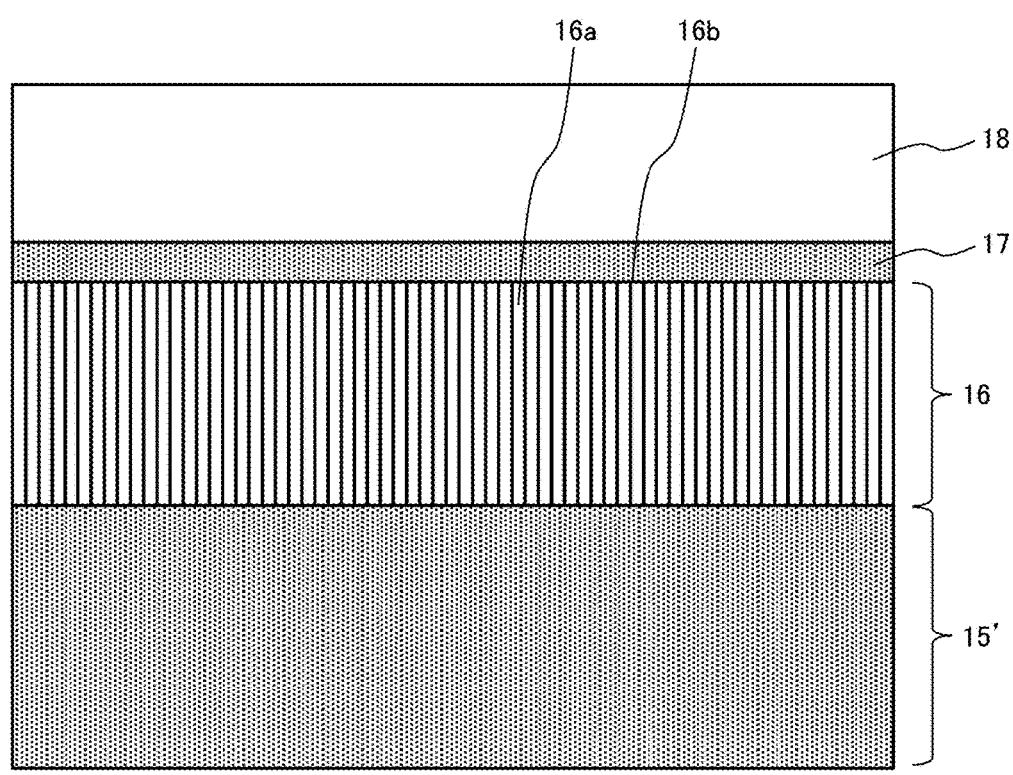
FIG. 10 is a schematic illustration showing an example of a cross-sectional microstructure of an $MgB_2$ superconducting thin-film wire of a third embodiment.

FIG. 10 is a schematic illustration showing an example of a cross-sectional microstructure of an $MgB_2$ superconducting thin-film wire of a third embodiment. As illustrated in FIG. 10, the $MgB_2$ superconducting thin-film wire of the third embodiment is made of a long substrate 15' mainly containing Fe (e.g., silicon steel tape). Because the long substrate 15' mainly contains Fe components in this embodiment, the Fe components can be diffused into the grain boundary regions 16b from the long substrate 15' during the diffusion heat treatment step. Consequently, diffusion distance for the transition metal elements serving as flux pinning centers can be halved, which makes it possible to reduce duration for the diffusion heat treatment to ½ to ¼.

Fourth Embodiment

{$MgB_2$ Superconducting Thin-Film Wire and Method for Producing Thereof}

Figure 11:
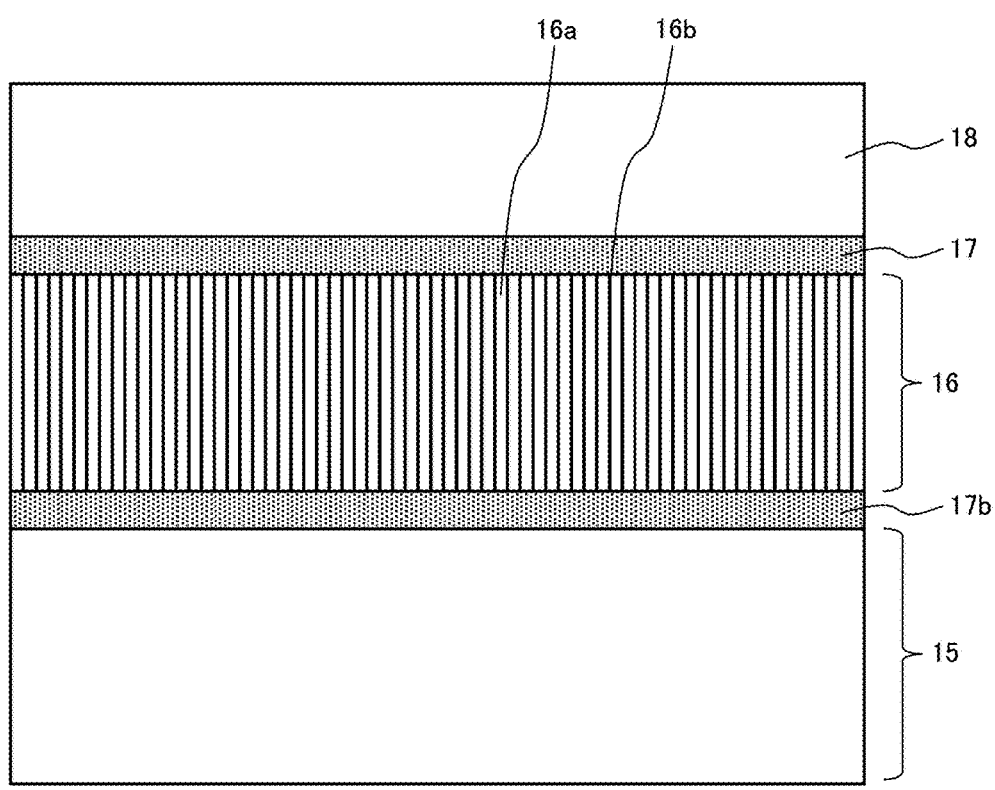
FIG. 11 is a schematic illustration showing an example of a cross-sectional microstructure of an $MgB_2$ superconducting thin-film wire of a fourth embodiment.

FIG. 11 is a schematic illustration showing an example of a cross-sectional microstructure of an $MgB_2$ superconducting thin-film wire of a fourth embodiment. As illustrated in FIG. 11, the $MgB_2$ superconducting thin-film wire of the fourth embodiment is different from the $MgB_2$ superconducting thin-film wire of the second embodiment (see FIG. 8) in that a transition metal element layer 17b is interposed between the long substrate 15 and the $MgB_2$ thin film 16. Other portions are the same. This embodiment is suitable for cases where the long substrate 15 contains a component that easily chemically combines with the $MgB_2$ thin film 16 (e.g., Cu component or Al component).

A production method of this embodiment can be achieved by simply adding, to the production method of the first embodiment, another transition metal element layer formation step between the long substrate preparation step and the $MgB_2$ thin film formation step. Similarly to the third embodiment, the diffusion distance for the transition metal elements serving as flux pinning centers can be halved, which makes it possible to reduce the duration for the diffusion heat treatment to ½ to ¼.

Fifth Embodiment

{$MgB_2$ Superconducting Thin-Film Wire and Method for Producing Thereof}

As described before, to apply superconducting wires to power-related devices (e.g., superconducting electromagnets, power cables), having both high $J_c$ characteristics and high electrical conduction characteristics is important. Accordingly, it is necessary to make the cross-sectional area of the conductor large. To do so, the thickness of the $MgB_2$ thin film to be applied to power-related devices is preferably micrometers order (e.g., 1 to 50 μm).

However, even in the thin film prepared by a vacuum process, diameters of the crystal grains tend to increase (i.e., the crystal grain boundary density decreases) as the film becomes thicker, and therefore, the $J_c$ characteristics of the thick $MgB_2$ thin film are prone to decrease. Furthermore, since the external magnetic fields are applied, in various directions, to a superconducting wire used for power-related devices, it is desirable that fluctuation of the $J_c$ characteristics due to the external magnetic fields be small. The $MgB_2$ superconducting thin-film wire of the fifth embodiment is suitable for solving that kind of problem.

Figure 12:
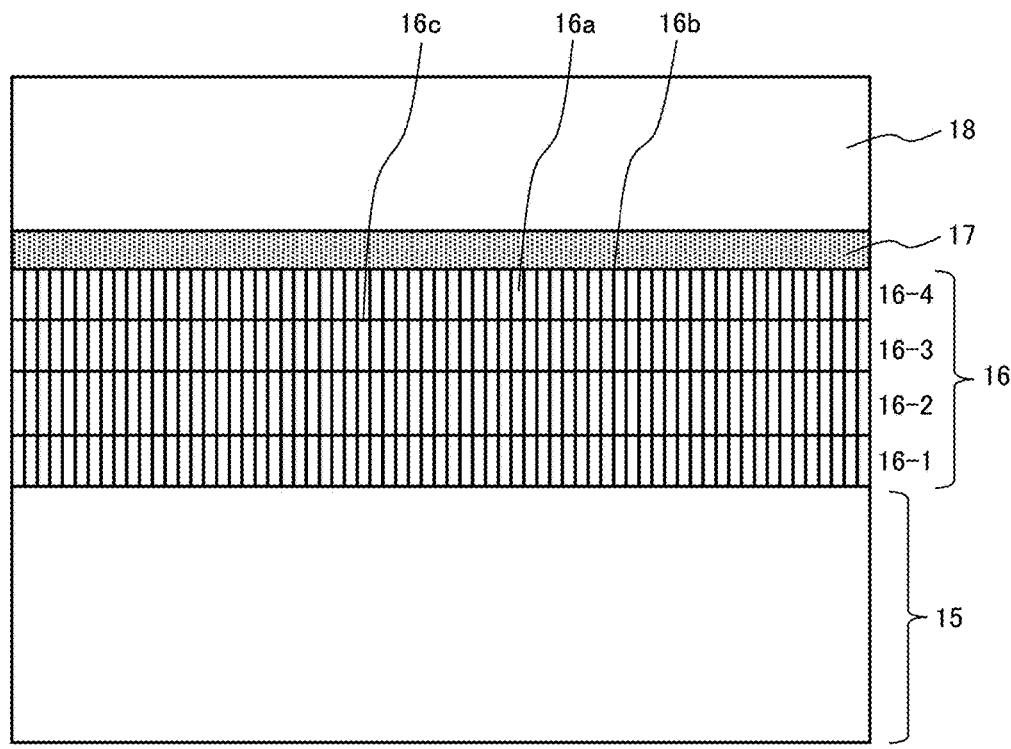
FIG. 12 is a schematic illustration showing an example of a cross-sectional microstructure of an $MgB_2$ superconducting thin-film wire of a fifth embodiment.

FIG. 12 is a schematic illustration showing an example of a cross-sectional microstructure of an $MgB_2$ superconducting thin-film wire of a fifth embodiment. As illustrated in FIG. 12, the $MgB_2$ superconducting thin-film wire of the fifth embodiment has a laminate structure made up of plural layers of $MgB_2$ thin film 16 (16-1 to 16-4), and consequently it is characterized in that each of the $MgB_2$ columnar crystal grains 16a has a grain boundary region 16c parallel to the surface of the long substrate 15, in addition to the grain boundary region 16b vertical to the surface of the long substrate 15. Other portions are the same as those of the $MgB_2$ superconducting thin-film wire of the second embodiment (see FIG. 8).

The production method of this embodiment is characterized in that formation of the $MgB_2$ thin film is repeated plural times in the $MgB_2$ thin film formation step. For example, first, by use of the $MgB_2$ thin film formation mechanism 10 shown in FIG. 3, an $MgB_2$ thin film 16-1 is formed along the entire length of the long substrate 15 while running the long substrate 15 in one direction. Next, while running, in the opposite direction to the former direction, the long substrate 15 on which the $MgB_2$ thin film 16-1 is formed, another $MgB_2$ thin film 16-2 is formed along the entire length of the long substrate 15. By repeating these procedures, a laminate structure made up of plural layers (16-1 to 16-4) can be formed.

Herein, a mechanism of forming a laminate structure of plural layers by this method is considered such that during an intermittence of thin-film depositions, a chemical combination occurs between $O_2$ (oxygen) gas slightly remaining in the $MgB_2$ thin film formation mechanism 10 and the surface of the $MgB_2$ thin film, and consequently an extremely thin oxide film (e.g., MgO film) would be formed.

Figure 13:
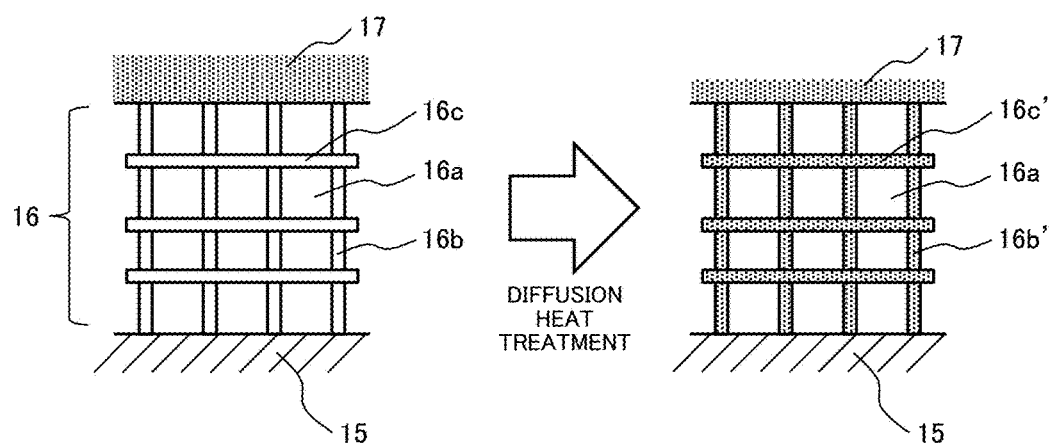
FIG. 13 is a schematic illustration showing an enlarged cross-sectional view of the $MgB_2$ thin film in the diffusion heat treatment step of the fifth embodiment.

FIG. 13 is a schematic illustration showing an enlarged cross-sectional view of the $MgB_2$ thin film in the diffusion heat treatment step of the fifth embodiment. As illustrated in FIG. 13, the transition metal elements constituting the transition metal element layer 17 are preferentially diffused into the grain boundary regions 16b and 16c (grain boundary diffusion), thereby forming grain boundary regions 16b' and 16c' wherein the transition metal elements are dispersed and segregated.

Figure 14:
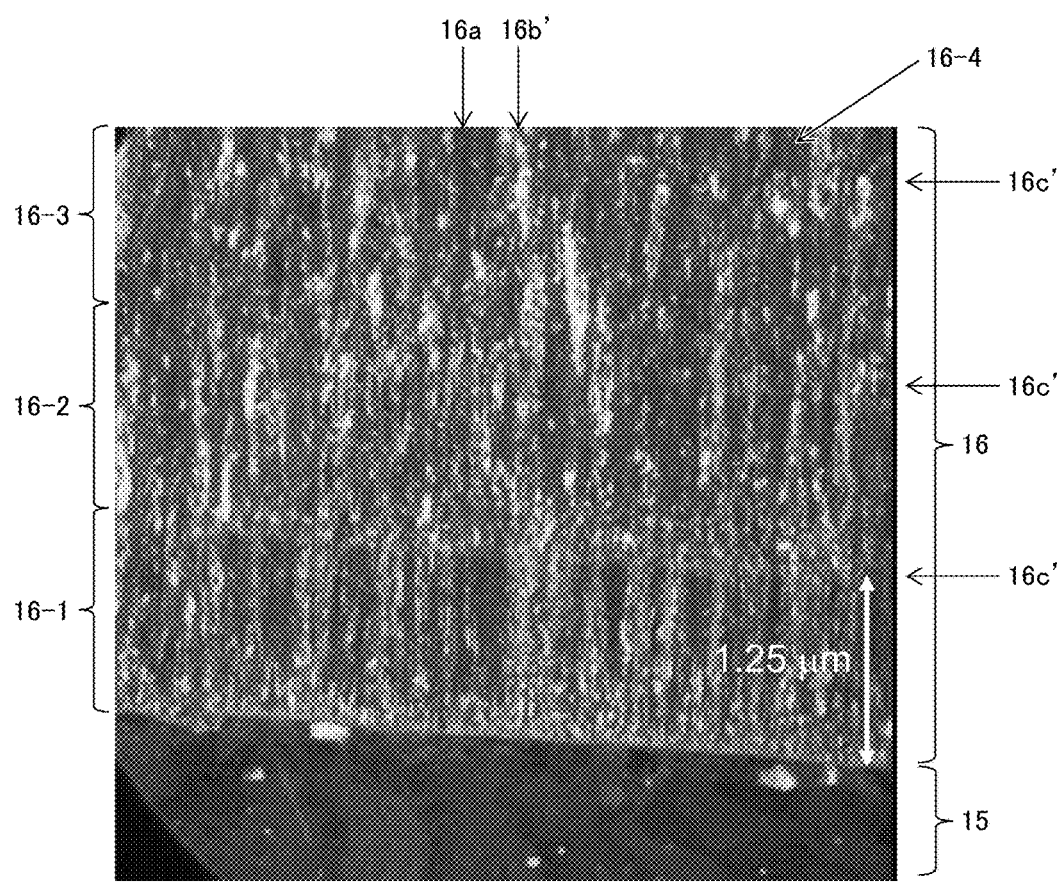
FIG. 14 is an image of a scanning electron microscopy (SEM) showing an example of a cross-sectional microtexture of the $MgB_2$ thin film after the diffusion heat treatment step in the fifth embodiment.

FIG. 14 is an image of a scanning electron microscopy (SEM) showing an example of a cross-sectional microtexture of the MgB$_2$ thin film after the diffusion heat treatment step in the fifth embodiment. FIG. 14 shows an example wherein each of the layers 16-1 to 16-4 of laminate structure in the MgB$_2$ thin film 16 is 1.25 μm thick (total thickness of 5 μm). In the image, there can be visibly confirmed: a laminate structure of plural layers (16-1 to 16-4) in the MgB$_2$ thin film 16; MgB$_2$ columnar crystal grains 16a; and grain boundary regions 16b' and 16c' in which transition metal elements are dispersed and segregated.

Figure 15:
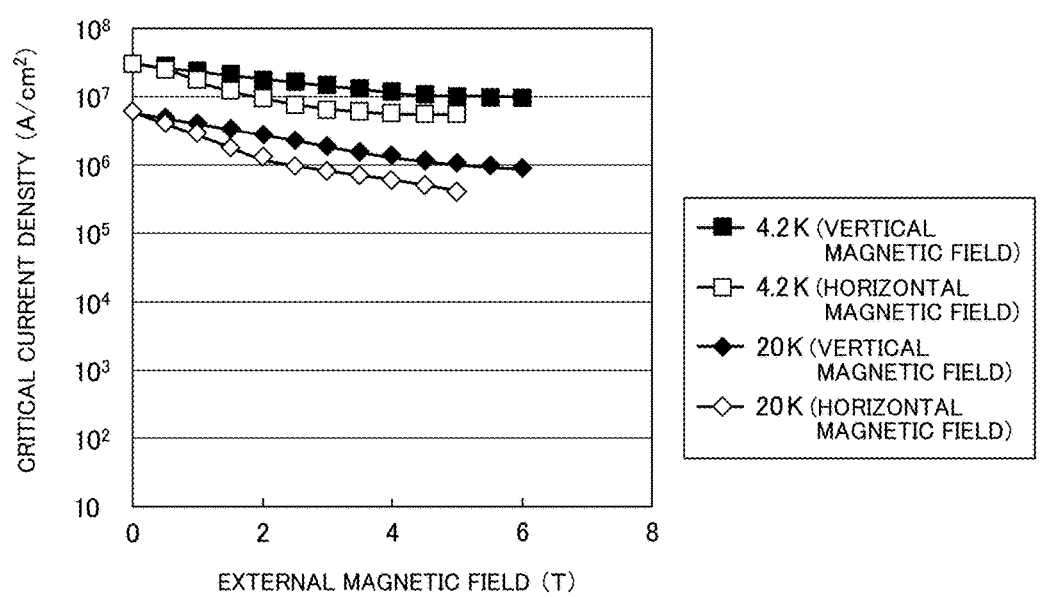
FIG. 15 is an exemplary graph showing a relationship between the critical current density ($J_c$) and the external magnetic field (B) in the $MgB_2$ superconducting thin-film wire of the fifth embodiment.

The J$_c$-B characteristics of the MgB$_2$ superconducting thin-film wire of this embodiment were measured (by a typical four-terminal electrical conduction method). This J$_c$-B measurement was carried out, at 4.2 K and at 20 K, in two ways: by vertically applying a magnetic field to the thin film surface; and by horizontally applying a magnetic field to the thin film surface. FIG. 15 is an exemplary graph showing a relationship between the critical current density (J$_c$) and the external magnetic field (B) in the MgB$_2$ superconducting thin-film wire of the fifth embodiment.

As shown in FIG. 15, it is verified that in the MgB$_2$ superconducting thin-film wire of this embodiment, difference of the J$_c$-B characteristics is small at temperatures of 4.2 K and 20 K, between cases when a horizontal magnetic field is applied and when a vertical magnetic field is applied. This is considered resulting from the fact that the grain boundary regions 16c' in which the transition metal elements are dispersed and segregated are formed, in addition to the grain boundary regions 16b' wherein the transition metal elements are dispersed and segregated.

Sixth Embodiment

{MgB$_2$ Superconducting Thin-Film Wire and Method for Producing Thereof}

Figure 16:
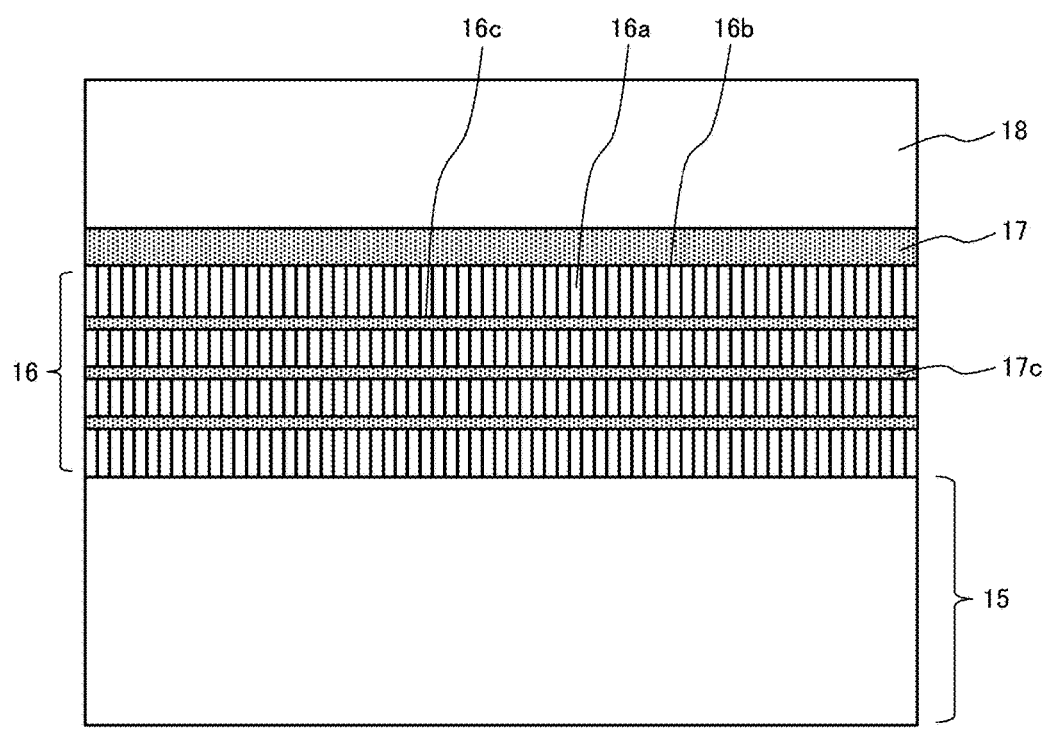
FIG. 16 is a schematic illustration showing an example of a cross-sectional microstructure of an $MgB_2$ superconducting thin-film wire of a sixth embodiment.

FIG. 16 is a schematic illustration showing an example of a cross-sectional microstructure of an MgB$_2$ superconducting thin-film wire of a sixth embodiment. As illustrated in FIG. 16, the MgB$_2$ superconducting thin-film wire of the sixth embodiment is different from the MgB$_2$ superconducting thin-film wire of the fifth embodiment (see FIG. 12) in that transition metal element intermediate layers 17c are interposed between plural layers 16-1 to 16-4 of the laminate structure in the MgB$_2$ thin film 16. Other portions are the same.

A production method of this embodiment can be achieved by simply adding, to the production method of the fifth embodiment, a step for forming a transition metal element intermediate layer 17c between the repeated formations of MgB$_2$ thin film in the MgB$_2$ thin film formation step. This embodiment can shorten the diffusion distance for the transition metal elements serving as flux pinning centers, compared to the third embodiment, which makes it possible to further reduce the duration for the diffusion heat treatment.

As has been described, the invented MgB$_2$ superconducting thin-film wire exhibits excellent J$_c$ characteristics under the 4.2 K magnetic field and the 20 K magnetic field. Thus, it can favorably be used for superconducting wires applied to superconducting magnetic systems such as NMRs, MRIs, Maglev Railways, etc.

The above-described embodiments have been specifically given in order to help with understanding on the present invention, but the invention is not limited to the configuration equipped with all the components described above. For example, some of the configurations of a certain embodiment may be replaced with the configurations of the other embodiments, and the configurations of the other embodiments may be added to the configurations of the subject embodiment. Furthermore, some of the configurations of each embodiment may be omitted, replaced with other configurations, and added to other configurations.

LEGEND

10 . . . MgB$_2$ thin film formation mechanism;
11 . . . electron gun array;
12 . . . linear-type raw material evaporation source;
12a . . . Mg evaporation source;
12b . . . B evaporation source;
13 . . . raw material vapor;
14 . . . reel;
15 and 15' . . . long substrate;
16, 16-1, 16-2, 16-3 and 16-4 . . . MgB$_2$ thin film;
16a . . . MgB$_2$ columnar crystal grains;
16b, 16b', 16c and 16c' . . . grain boundary regions;
17 and 17b . . . transition metal element layer;
17c . . . transition metal element intermediate layer; and
18 . . . superconducting stabilizing layer.

The invention claimed is:

1. A magnesium diboride superconducting thin-film wire, comprising:
a long substrate;
a magnesium diboride thin film formed on the long substrate, wherein the magnesium diboride thin film includes magnesium diboride columnar crystal grains; and
a transition metal element layer formed on the magnesium diboride thin film, wherein the transition metal layer is diffused into grain boundaries of the magnesium diboride columnar crystal grains;
wherein:
the magnesium diboride thin film has a microtexture such that the magnesium diboride columnar crystal grains stand densely together on a surface of the long substrate, and
the transition metal element layer is formed from a predetermined transition metal element that has a body-centered cubic lattice structure.

2. The magnesium diboride superconducting thin-film wire according to claim 1, wherein the magnesium diboride thin film has a laminate structure made up of a plurality of layers.

3. The magnesium diboride superconducting thin-film wire according to claim 2, wherein the transition metal element layer is formed between the plurality of layers.

4. The magnesium diboride superconducting thin-film wire according to claim 2, wherein the long substrate contains iron as a main constituent.

5. The magnesium diboride superconducting thin-film wire according to claim 1, wherein the predetermined transition metal element contains at least iron or manganese.

6. The magnesium diboride superconducting thin-film wire according to claim 1, wherein an additional layer of the transition metal element is formed between the long substrate and the magnesium diboride thin film.

7. The magnesium diboride superconducting thin-film wire according to claim 1, wherein the predetermined transition metal element is vanadium.

8. The magnesium diboride superconducting thin-film wire according to claim 1, wherein the predetermined transition metal element is manganese.

9. The magnesium diboride superconducting thin-film wire according to claim 1, wherein the predetermined transition metal element is iron.

10. The magnesium diboride superconducting thin-film wire according to claim 1, wherein the predetermined transition metal element is niobium.

11. The magnesium diboride superconducting thin-film wire according to claim 1, wherein the predetermined transition metal element is molybdenum.

12. The magnesium diboride superconducting thin-film according to claim 1, wherein the predetermined transition metal element is tantalum.

13. The magnesium diboride superconducting thin-film wire according to claim 1, wherein the predetermined transition metal element is tungsten.

14. A method for producing a magnesium diboride superconducting thin-film wire comprising the steps of:
- forming, on a long substrate, a magnesium diboride thin film having a microtexture such that magnesium diboride columnar crystal grains stand densely together on the surface of the long substrate;
- forming a layer of a predetermined transition metal element on the surface of the magnesium diboride thin film and/or between the long substrate and the magnesium diboride thin film; and
- diffusing the predetermined transition metal element preferentially into the grain boundary regions of the magnesium diboride columnar crystal grains by a heat treatment,
- the predetermined transition metal element is an element having a body-centered cubic lattice structure.

15. The method for producing a magnesium diboride superconducting thin-film wire according to claim 14, wherein the step of forming the magnesium diboride thin film includes a plurality of times of depositing magnesium diboride thin film layers to form a laminate structure made up of a plurality of layers.

16. The method for producing a magnesium diboride superconducting thin-film wire according to claim 15, wherein the step of forming the magnesium diboride thin film further includes the step of depositing a transition metal element intermediate layer between the magnesium diboride thin film layers.

17. The method for producing a magnesium diboride superconducting thin-film wire according to claim 14, wherein the predetermined transition metal element contains at least iron or manganese.

18. The method for producing a magnesium diboride superconducting thin-film wire according to claim 14, wherein: the magnesium diboride thin film is formed under a vacuum at temperatures from 250° C. to 300° C. in the step of forming of the magnesium diboride thin film; and
- diffusion heat treatment for the transition metal element is performed under a vacuum at temperatures from 300° C. to below 600° C. in the step of diffusing the predetermined transition metal element.

* * * * *